(12) United States Patent
Kim et al.

(10) Patent No.: US 11,643,597 B2
(45) Date of Patent: *May 9, 2023

(54) SEMICONDUCTOR NANOCRYSTAL PARTICLES AND DEVICES INCLUDING THE SAME

(71) Applicant: SAMSUNG ELECTRONICS CO., LTD., Suwon-si (KR)

(72) Inventors: Tae Hyung Kim, Seoul (KR); Hyun A Kang, Suwon-si (KR); Eun Joo Jang, Suwon-si (KR); Dae Young Chung, Suwon-si (KR)

(73) Assignee: SAMSUNG ELECTRONICS CO., LTD., Gyenonggi-Do (KR)

( * ) Notice: Subject to any disclaimer, the term of this patent is extended or adjusted under 35 U.S.C. 154(b) by 24 days.

This patent is subject to a terminal disclaimer.

(21) Appl. No.: 17/203,872

(22) Filed: Mar. 17, 2021

(65) Prior Publication Data
US 2021/0198569 A1  Jul. 1, 2021

Related U.S. Application Data

(63) Continuation of application No. 16/103,182, filed on Aug. 14, 2018, now Pat. No. 10,975,299.

(30) Foreign Application Priority Data

Aug. 14, 2017 (KR) ........................ 10-2017-0103127

(51) Int. Cl.
*H01L 51/50* (2006.01)
*C09K 11/70* (2006.01)
(Continued)

(52) U.S. Cl.
CPC ........ *C09K 11/703* (2013.01); *H01L 51/5056* (2013.01); *H01L 51/5072* (2013.01);
(Continued)

(58) Field of Classification Search
CPC .............. C09K 11/703; H01L 51/5056; H01L 51/5072; H01L 51/502; H01L 2251/303;
(Continued)

(56) References Cited

U.S. PATENT DOCUMENTS 8,404,154 B2  3/2013  Breen et al.
8,609,245 B2  12/2013  Jang et al.
(Continued)

FOREIGN PATENT DOCUMENTS

JP  2012193283 A  10/2012
KR  1020100071700 A  6/2010
(Continued)

OTHER PUBLICATIONS

Office Action dated Sep. 16, 2021 of the corresponding Korean Patent Application No. 10-2017-0103127.
(Continued)

*Primary Examiner* — Mohammed Shamsuzzaman
(74) *Attorney, Agent, or Firm* — Cantor Colburn LLP

(57) ABSTRACT

Disclosed are a semiconductor nanocrystal particle including indium (In), zinc (Zn), and phosphorus (P), wherein a mole ratio of the zinc relative to the indium is greater than or equal to about 25:1, and the semiconductor nanocrystal particle includes a core including a first semiconductor material including indium, zinc, and phosphorus and a shell disposed on the core and including a second semiconductor material including zinc and sulfur, a method of producing the same, and an electronic device including the same. The semiconductor nanocrystal particle emits blue light having a maximum peak emission at a wavelength of less than or equal to about 470 nanometers.

14 Claims, 16 Drawing Sheets

| Cathode (e.g., Al and the like) |
|---|
| Electron auxiliary layer (e.g., ETL) |
| Emissive layer |
| Hole auxiliary layer (e.g., HTL) |
| Transparent electrode (e.g., ITO anode) |
| Transparent substrate |

(51) Int. Cl.
  *B82Y 20/00* (2011.01)
  *B82Y 40/00* (2011.01)
(52) U.S. Cl.
  CPC .............. *B82Y 20/00* (2013.01); *B82Y 40/00* (2013.01); *H01L 51/502* (2013.01); *H01L 2251/303* (2013.01); *H01L 2251/5369* (2013.01)
(58) Field of Classification Search
  CPC ....... H01L 2251/5369; H01L 21/02601; H01L 29/0665; B82Y 20/00; B82Y 40/00
  See application file for complete search history.

(56) References Cited

U.S. PATENT DOCUMENTS

| | | | |
|---|---|---|---|
| 9,834,724 | B2 | 12/2017 | Kim et al. |
| 9,853,190 | B2 | 12/2017 | Glarvey et al. |
| 10,508,236 | B2 | 12/2019 | Houtepen et al. |
| 2010/0051901 | A1 | 3/2010 | Kazlas et al. |
| 2010/0159248 | A1* | 6/2010 | Jang ............... H05B 33/14 977/774 |
| 2014/0003074 | A1 | 1/2014 | Kishimoto |
| 2014/0046083 | A1 | 2/2014 | Tilyou et al. |
| 2014/0158977 | A1 | 6/2014 | Supran et al. |
| 2014/0264172 | A1* | 9/2014 | Daniels ............. B01J 2/003 252/301.6 S |
| 2015/0004775 | A1 | 1/2015 | Huang et al. |
| 2015/0194577 | A1 | 7/2015 | Glarvey |
| 2017/0186829 | A1* | 6/2017 | Yamazaki ........ H01L 27/3262 |
| 2017/0306227 | A1 | 10/2017 | Ippen et al. |
| 2018/0047878 | A1 | 2/2018 | Glarvey et al. |
| 2018/0094190 | A1 | 4/2018 | Kim et al. |
| 2018/0119007 | A1* | 5/2018 | Ippen ............... C09K 11/883 |
| 2018/0327664 | A1* | 11/2018 | Houtepen ........... C09K 11/62 |
| 2018/0375046 | A1* | 12/2018 | Lee .................. C09K 11/02 |
| 2019/0157596 | A1 | 5/2019 | Kim et al. |
| 2019/0218456 | A1* | 7/2019 | Sasaki ............... H01L 29/06 |
| 2019/0273178 | A1* | 9/2019 | Jen-La Plante ...... C09K 11/54 |

FOREIGN PATENT DOCUMENTS

| | | |
|---|---|---|
| KR | 1244696 B1 | 3/2013 |
| KR | 1020140056500 A | 5/2014 |
| KR | 1020140117204 A | 10/2014 |
| KR | 1020140121217 A | 10/2014 |
| KR | 101525524 B1 | 6/2015 |
| KR | 101563878 B1 | 10/2015 |
| KR | 1020170080795 A | 7/2017 |

OTHER PUBLICATIONS

Yemliha Altintas et al., "Highly Efficient Cd-Free Alloyed Core/Shell Quantum Dots with Optimized Precursor Concentrations", The Journal of Physical chemistry C, Mar. 17, 2016, pp. 7885-7892, vol. 120, Issue 14.

Kipil Lim et al., "Synthesis of blue emitting InP/ZnS quantum dots through control of competition between etching and growth", Nanotechnology, Nov. 9, 2012, pp. 1-7, vol. 23.

Taehoon Kim et al., "Large-Scale Synthesis of InPZnS Alloy Quantum Dots with Dodecanethiol as a Composition Controller", The journal of physical chemistry letters, Dec. 26, 2011, pp. 214-218, vol. 3, Issue 2.

Xuyong Yang et al., "Full Visible Range Covering InP/ZnS Nanocrystals with High Photometric Performance and Their Application to White Quantum Dot Light-Emitting Diodes", Advanced Materials, Apr. 30, 2012, pp. 4180-4185, vol. 24, Issue 30.

Notice of Allowance, dated Apr. 29, 2022, in connection with the corresponding Korean Patent Application No. 10-2017-0103127.

* cited by examiner

SEMICONDUCTOR NANOCRYSTAL PARTICLES AND DEVICES INCLUDING THE SAME

CROSS-REFERENCE TO RELATED APPLICATION

This application is a continuation application of application Ser. No. 16/103,182, filed Aug. 14, 2018, which claims priority to and the benefit of Korean Patent Application No. 10-2017-0103127 filed in the Korean Intellectual Property Office on Aug. 14, 2017, and all the benefits accruing therefrom under 35 U.S.C. § 119, the entire content of which is incorporated herein by reference.

BACKGROUND

1. Field

A semiconductor nanocrystal particle and a device including the same are disclosed.

2. Description of the Related Art

Physical characteristics (e.g., energy bandgaps) of nanoparticles that are intrinsic characteristics of nanoparticles may be controlled by changing their particle size, unlike bulk materials. For example, semiconductor nanocrystal particles also known as quantum dots are a crystalline material having a size of several nanometers. Such semiconductor nanocrystal particles have such a small size that they have a large surface area per unit volume and exhibit quantum confinement effects, and thus have different properties from the characteristics of bulk materials having the same composition. Quantum dots may absorb light from an excitation source to be, e.g., and may be, excited, and may emit energy corresponding to an energy bandgap of the quantum dots.

Quantum dots may be synthesized using a vapor deposition method of metal organic chemical vapor deposition (MOCVD), molecular beam epitaxy (MBE), and the like, a wet chemical method of adding precursor materials to an organic solvent to grow crystals, and the like. In the wet chemical method, organic compounds such as ligands/coordinating solvents may be coordinated on surfaces of nanocrystals to control a crystal growth during the crystal growth.

In order to improve photoluminescence properties of quantum dots, a core-shell structure may be used, but core-shell quantum dots having desirable properties may be cadmium-based materials. Accordingly, desired is development of cadmium-free semiconductor nanocrystal particles having desirable photoluminescence properties.

SUMMARY

An embodiment provides a cadmium-free semiconductor nanocrystal particle capable of emitting blue light with improved efficiency.

Another embodiment provides a method of producing the semiconductor nanocrystal particle.

Yet another embodiment provides an electronic device including the semiconductor nanocrystal particle.

In an embodiment, a semiconductor nanocrystal particle includes indium (In), zinc (Zn), and phosphorus (P), wherein a mole ratio of zinc relative to indium is greater than or equal to about 25:1, and the semiconductor nanocrystal particle includes a core including a first semiconductor material including indium, zinc, and phosphorus, and a shell disposed on the core and including a second semiconductor material including zinc and sulfur.

The semiconductor nanocrystal particle may emit blue light having a maximum peak emission at a wavelength of less than or equal to about 470 nanometers (nm).

The semiconductor nanocrystal particle may have quantum efficiency of greater than or equal to about 40%.

The semiconductor nanocrystal particle may have quantum efficiency of greater than or equal to about 45%.

The semiconductor nanocrystal particle may have quantum efficiency of greater than or equal to about 50%.

The mole ratio of the zinc relative to a mole amount of indium may be greater than or equal to about 29:1.

The mole ratio of the zinc relative to a mole amount of indium may be greater than or equal to about 29.5:1.

The mole ratio of the zinc relative to a mole amount of indium may be greater than or equal to about 30:1.

The semiconductor nanocrystal particle may have a mole ratio of sulfur relative to indium of greater than or equal to about 18:1.

The semiconductor nanocrystal particle may have a mole ratio of sulfur relative to indium of greater than or equal to about 25:1.

The semiconductor nanocrystal particle may have a mole ratio of phosphorus relative to indium of less than about 1:1.

The semiconductor nanocrystal particle may have a mole ratio of phosphorus relative to indium of less than or equal to about 0.85:1.

The core may include the zinc in a lattice of a zinc blend crystal structure of InP.

The first semiconductor material may include InZnP.

The second semiconductor material may include ZnS.

The semiconductor nanocrystal particle may have an average size of less than or equal to about 4.5 nm.

The semiconductor nanocrystal particle may have an average size of less than or equal to about 4 nm.

The core may have a size of less than or equal to about 2 nm.

The shell may not include selenium.

The semiconductor nanocrystal particle may emit blue light having a maximum peak emission of the blue light may be present at a wavelength of about 440 nm to about 470 nm.

The semiconductor nanocrystal particle may have quantum efficiency of greater than or equal to about 45%.

The semiconductor nanocrystal particle may have quantum efficiency of greater than or equal to about 50%.

The maximum peak emission of the blue light may have a full width at half maximum (FWHM) of less than or equal to about 60 nm.

In an embodiment, a method of producing a cadmium-free semiconductor nanocrystal particle emitting blue light includes heating a first solution including an indium precursor, a first zinc precursor, a first organic ligand, and a first organic solvent at a first temperature of greater than or equal to about 100° C. and less than about 180° C., adding a phosphorus precursor to the first solution to obtain a second solution;

heating the second solution at a second temperature of greater than or equal to about 180° C. and less than or equal to about 260° C. to synthesize a core including a first semiconductor material, the first semiconductor material including indium, phosphorus, and zinc;

separating the core from the second solution;

heating a third solution including a second zinc precursor, a second organic ligand, and a second organic solvent to a third temperature that is less than a shell-forming temperature, to obtain a heated third solution;

adding the core and a sulfur precursor to the heated third solution to obtain a fourth solution; and heating the fourth solution at a shell-forming temperature to form a shell including a second semiconductor material including zinc and sulfur, on the core.

The indium precursor may include indium acetate, alkylated indium (e.g., trimethyl indium), indium hydroxide, indium chloride, indium oxide, indium nitrate, indium sulfate, or a combination thereof.

The first zinc precursor and the second zinc precursor may be the same or different and may independently include a Zn metal powder, ZnO, an alkylated Zn compound, a Zn alkoxide, a Zn carboxylate, a Zn nitrate, a Zn perchlorate, a Zn sulfate, a Zn acetylacetonate, a Zn halide, a Zn cyanide, a Zn hydroxide, or a combination thereof.

The first organic ligand and the second organic ligand may be the same or different and may independently include $RCOOH$, $RNH_2$, $R_2NH$, $R_3N$, $RSH$, $RH_2PO$, $R_2HPO$, $R_3PO$, $RH_2P$, $R_2HP$, $R_3P$, $ROH$, $RCOOR'$, $RPO(OH)_2$, $RHPOOH$, $RHPOOH$, or a combination thereof, wherein R and R' independently include a substituted or unsubstituted C1 to C40 (or to C24) aliphatic hydrocarbon, a substituted or unsubstituted C6 to C20 aromatic hydrocarbon, or a combination thereof.

The phosphorus precursor may include tris(trimethylsilyl) phosphine, tris(dimethylamino) phosphine, triethylphosphine, tributylphosphine, trioctylphosphine, triphenylphosphine, tricyclohexylphosphine, or a combination thereof.

In the first solution, a mole ratio of the first zinc precursor relative to the indium precursor may be greater than or equal to about 1.7:1.

The first solution may not include dodecane thiol.

The first ligand may include an amine compound.

The semiconductor nanocrystal particle may include indium (In), zinc (Zn), and phosphorus (P) and a mole ratio of zinc relative to indium greater than or equal to about 25:1.

The semiconductor nanocrystal particle may emit blue light having a maximum peak emission at a wavelength of less than or equal to about 470 nm.

The semiconductor nanocrystal particle may have quantum efficiency of greater than or equal to about 40%.

In an embodiment, an electronic device includes
a first electrode and a second electrode facing each other; and
a quantum dot emission layer disposed between the first electrode and the second electrode, the quantum dot emission layer including a plurality of semiconductor nanocrystals, wherein the plurality of semiconductor nanocrystals includes the semiconductor nanocrystal particle.

The electronic device may include an auxiliary layer including (e.g., crystalline) ZnO (e.g., nanoparticles) between the first electrode and the quantum dot emission layer or between the second electrode and the quantum dot emission layer.

An indium-based semiconductor nanocrystal particle capable of emitting blue light is provided. The semiconductor nanocrystal particle may be applied to various display devices, biolabeling (biosensor, bioimaging), a photodetector, a solar cell, a polymer composite, an organic/inorganic hybrid composite, and the like.

DETAILED DESCRIPTION

Figure 1:
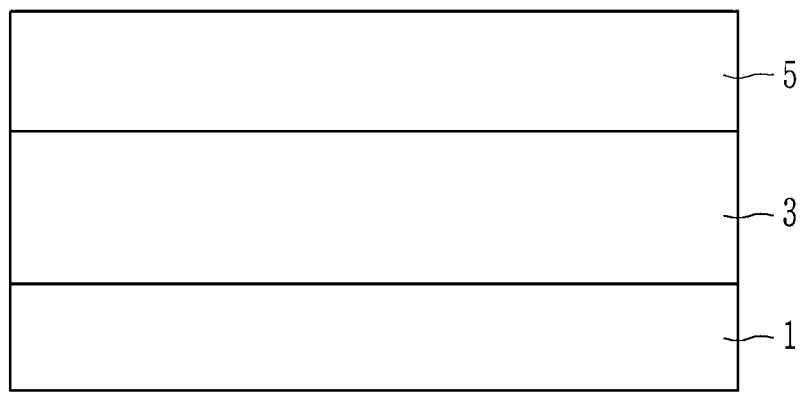
FIG. 1 shows a schematic cross-section of an electronic device according to a non-limiting embodiment.

Advantages and characteristics of this disclosure, and a method for achieving the same, will become evident referring to the following example embodiments together with the drawings attached hereto. However, the embodiments should not be construed as being limited to the embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising", will be understood to imply the inclusion of stated elements but not the exclusion of any other elements. Further, the singular includes the plural unless mentioned otherwise.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10%, or 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, as used herein, when a definition is not otherwise provided, "substituted" refers to replacement of hydrogen of a compound or a corresponding moiety with a C1 to C30 alkyl group, a C2 to C30 alkenyl group, a C2 to C30 alkynyl group, a C6 to C30 aryl group, a C7 to C30 alkylaryl group, a 01 to C30 alkoxy group, a 01 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—$NO_2$), a cyano group (—CN), an amino group (—NRR' wherein R and R' independently include hydrogen or a C1 to C6 alkyl group), an azido group (—$N_3$), an amidino group (—C(=NH)$NH_2$), a hydrazino group (—$NHNH_2$), a hydrazono group (=N($NH_2$)), an aldehyde group (—O(=O)H), a carbamoyl group (—C(O)$NH_2$), a thiol group (—SH), an ester group (—O(=O)OR, wherein R is a C1 to C6 alkyl group or a C6 to C12 aryl group), a carboxyl group (—COOH) or a salt thereof (—O(=O)OM, wherein M is an organic or inorganic cation), a sulfonic acid group (—$SO_3$H) or a salt thereof (~$SO_3$M, wherein M is an organic or inorganic cation), a phosphoric acid group (—$PO_3H_2$) or a salt thereof (~$PO_3$MH or —$PO_3M_2$, wherein M is an organic or inorganic cation), or a combination thereof.

Herein, a hydrocarbon group refers to a group including carbon and hydrogen (e.g., alkyl, alkenyl, alkynyl, or aryl group). The hydrocarbon group may be a group having a monovalence or greater formed by removal of one or more hydrogen atoms from, alkane, alkene, alkyne, or arene. In the hydrocarbon group, at least one methylene may be replaced with an oxide moiety, a carbonyl moiety, or a combination thereof.

Herein, the term aliphatic refers to a saturated or unsaturated linear or branched hydrocarbon group. An aliphatic group may be an alkyl, alkenyl, or alkynyl group, for example.

Herein, the term aromatic refers to an organic compound or group comprising at least one unsaturated cyclic group having delocalized pi electrons. The term encompasses both hydrocarbon aromatic compounds and heteroaromatic compounds.

Herein, the term alkyl refers to a linear or branched saturated monovalent hydrocarbon group (methyl, ethyl, hexyl, etc.).

Herein, the term alkenyl refers to a linear or branched monovalent hydrocarbon group having one or more carbon-carbon double bond.

Herein, the term alkynyl refers to a linear or branched monovalent hydrocarbon group having one or more carbon-carbon triple bond.

Herein, the term aryl refers to a group formed by removal of at least one hydrogen from an aromatic group (e.g., a phenyl or a naphthyl group).

Herein, the term hetero refers to inclusion of 1 to 3 heteroatoms that are N, O, S, Si, P, or a combination thereof.

If not defined otherwise, alkyl refers to a C1 to C20 alkyl, or a 01 to C12 alkyl, or a C1 to C6 alkyl.

As used herein, the term "group" refers to a group of Periodic Table. A semiconductor nanocrystal particle (hereinafter, referred to a quantum dot) may absorb light from an excitation source and may emit energy corresponding to their energy bandgap. For example, as the size of a quantum dot increases, the quantum dot may have narrow energy bandgaps and increased light emitting wavelengths. A semiconductor nanocrystal has drawn attention as a light emitting material in various fields such as in a display device, an energy device, or a bio light emitting device.

Quantum dots having photoluminescence properties at an applicable level may be based on cadmium (Cd). Cadmium may cause severe environment/health problems and a restricted element by Restriction of Hazardous Substances Directive (RoHS) in a plurality of countries. Accordingly, desired is development of a cadmium-free quantum dot having improved photoluminescence properties. An indium phosphide-based quantum dot as an alternative material may replace a cadmium-based quantum dot. A cadmium-based quantum dot may exhibit better performance than an InP-based quantum dot (e.g., photoluminescence properties such as a light emitting wavelength, luminous efficiency, and the like). For example, it has been difficult to develop an InP-based quantum dot emitting light having a maximum peak emission at a wavelength of less than or equal to about 470 nm (or less than about 470 nm) with improved quantum efficiency (e.g., greater than or equal to about 40%).

An indium phosphide-based semiconductor nanocrystal particle according to an embodiment has a structure and a composition which will be described later and may emit blue light with improved efficiency.

In an embodiment, a semiconductor nanocrystal particle includes indium (In), zinc (Zn), and phosphorus (P). The particle includes a core including a first semiconductor material including indium, zinc, and phosphorus and a shell disposed on the core and including a second semiconductor material including zinc and sulfur. The semiconductor nanocrystal particle emits blue light having a maximum peak emission at a wavelength of less than or equal to about 470 nm. In the semiconductor nanocrystal particle, a mole ratio of the zinc relative to the indium may be greater than or equal to about 25:1. In an embodiment, the mole ratio of the zinc relative to the indium may be greater than or equal to about 28:1, greater than or equal to about 29:1, or greater than or equal to about 30:1. The mole ratio of the zinc relative to the indium may be less than or equal to about 55:1, for example, less than or equal to about 50:1, less than or equal to about 45:1, less than or equal to about 40:1, less than or equal to about 35:1, less than or equal to about 34:1, less than or equal to about 33:1, or less than or equal to about 32:1. Without wishing to be bound by any particular theory, the aforementioned composition may contribute to a blue light emission of the semiconductor nanocrystal particle with improved efficiency. The mole ratio may be confirmed by an appropriate means such as an inductively coupled plasma-atomic emission spectroscopy (ICP-AES), an energy disperse X-ray spectroscopy (EDS), or the like.

In the semiconductor nanocrystal particle, the mole ratio of sulfur relative to indium may be greater than or equal to about 18:1, for example greater than or equal to about 20:1, greater than or equal to about 21:1, greater than or equal to about 22:1, greater than or equal to about 23:1, greater than or equal to about 24:1, greater than or equal to about 25:1, or greater than or equal to about 26:1. In the semiconductor nanocrystal particle, the mole ratio of the sulfur relative to the indium may be less than or equal to about 60:1, for example, less than or equal to about 50:1, less than or equal to about 45:1, less than or equal to about 40:1, less than or equal to about 35:1, less than or equal to about 30:1, less than or equal to about 29:1, less than or equal to about 28:1, or less than or equal to about 27:1. In the semiconductor nanocrystal particle, a mole ratio of phosphorus relative to indium may be less than about 1:1. For example, in the semiconductor nanocrystal particle, the mole ratio of the phosphorus relative to the indium may be less than or equal to about 0.87:1, less than or equal to about 0.86:1, less than or equal to about 0.85:1, less than or equal to about 0.84:1, less than or equal to about 0.83:1, or less than or equal to about 0.82:1. In the semiconductor nanocrystal particle, a mole ratio of phosphorus relative to indium may be greater than or equal to about 0.2:1, for example, greater than or equal to about 0.3:1, greater than or equal to about 0.4:1, or greater than or equal to about 0.5:1. The semiconductor nanocrystal particle may not include cadmium.

In the core/shell structure, the first semiconductor material may include InZnP. The core may not include sulfur.

In the core/shell structure, the second semiconductor material may include ZnS. For example, the shell may not include selenium. The shell may be a multi-layered shell including a plurality of layers. In the plurality of layers, adjacent layers may include semiconductor materials having different compositions. The shell may be a gradient alloy having a concentration changing along with a radial direction.

The semiconductor nanocrystal particle may have any suitable shape that is not particularly limited. The shape of the semiconductor nanocrystal may include a spherical shape, an ellipsoid shape, a pyramid shape, a cube shape, a rectangular parallelepiped shape, a polyhedron shape, a multipod shape, or a combination thereof, but is not limited thereto.

An average size of the semiconductor nanocrystal particle may be less than or equal to about 4.5 nm, for example, less than or equal to about 4.3 nm, less than or equal to about 4.2 nm, less than or equal to about 4.1 nm, or less than or equal to about 4 nm. An average size of the semiconductor nanocrystal particle may be greater than or equal to about 2.5 nm, greater than or equal to about 2.6 nm, greater than or equal to about 2.7 nm, greater than or equal to about 2.8 nm, greater than or equal to about 2.9 nm, greater than or equal to about 3 nm, greater than or equal to about 3.1 nm, greater than or equal to about 3.2 nm, greater than or equal to about 3.3 nm, or greater than or equal to about 3.4 nm. A size of the core may be less than or equal to about 2 nm, for example, less than or equal to about 1.9 nm, less than or equal to about 1.8 nm, or less than or equal to about 1.7 nm. The size of the core may be greater than or equal to about 1 nm, for example, greater than or equal to about 1.1 nm, greater than or equal to about 1.2 nm, greater than or equal to about 1.3 nm, greater than or equal to about 1.4 nm, or greater than or equal to about 1.5 nm. The core size may be calculated from an ultraviolet (UV) first absorption wavelength. Without wishing to be bound by any particular theory, within the ranges of the core size, the semiconductor nanocrystal according to an embodiment may exhibit desirable photoluminescence properties. A thickness of the shell may be greater than or equal to about 1 nm, for example, greater than about 1 nm, greater than or equal to about 1.1 nm, greater than or equal to about 1.2 nm, greater than or equal to about 1.3 nm, greater than or equal to about 1.4 nm or greater than or equal to about 1.5 nm. The thickness of the shell may be less than or equal to about 3 nm, for example, 2.9 nm, less than or equal to about 2.8 nm, less than or equal to about 2.7 nm, less than or equal to about 2.6 nm, less than or equal to about 2.5 nm, less than or equal to about 2.4 nm, less than or equal to about 2.3 nm, less than or equal to about 2.2 nm, less than or equal to about 2.1 nm, less than or equal to about 2.0 nm, less than or equal to about 1.9 nm, or less than or equal to about 1.8 nm.

Without wishing to be bound by any particular theory, within the ranges of the core size, the semiconductor nanocrystal according to an embodiment may exhibit desirable photoluminescence properties. As used herein, the size of the semiconductor nanocrystal may be a diameter. When the particle has a polygonal or multipod shape, the size of the particle may be a diameter calculated from a two dimensional area determined in an electron microscopic analysis.

The semiconductor nanocrystal particle according to an embodiment may emit blue light having a maximum peak emission at a wavelength of greater than or equal to about 430 nm (e.g., greater than or equal to about 440 nm, greater than or equal to about 450 nm, greater than or equal to about 451 nm, greater than or equal to about 452 nm, greater than or equal to about 453 nm, greater than or equal to about 454 nm, greater than or equal to about 455 nm, greater than or equal to about 456 nm, greater than or equal to about 457 nm, greater than or equal to about 458 nm, greater than or equal to about 459 nm, or greater than or equal to about 460 nm) and less than or equal to about 470 nm (e.g., less than about 470 nm, less than or equal to about 468 nm, less than or equal to about 467 nm, less than or equal to about 466 nm, or less than or equal to about 465 nm). The blue light may have a maximum light emitting peak wavelength of about 452 nm to about 468 nm. The maximum peak emission may have a full width at half maximum (FWHM) of less than or equal to about 65 nm, for example, less than or equal to about 63 nm, less than or equal to about 62 nm, less than or equal to about 61 nm, or less than or equal to about 60 nm.

The semiconductor nanocrystal may have quantum efficiency of greater than or equal to about 40%, for example, greater than or equal to about 41%, greater than or equal to about 42%, greater than or equal to about 43%, greater than or equal to about 44%, greater than or equal to about 45%, greater than or equal to about 46%, greater than or equal to about 47%, greater than or equal to about 48%, greater than or equal to about 49%, and greater than or equal to about 50%. The semiconductor nanocrystal may have quantum efficiency of greater than or equal to about 80%, greater than or equal to about 90%, greater than or equal to about 95%, greater than or equal to about 99%, or 100%.

The semiconductor nanocrystal particle includes an organic ligand bonded on, e.g., to, the surface of the semiconductor nanocrystal particle, and the ligand may include an amine compound and a carboxylic acid compound. The organic ligand is illustrated in detail hereinafter.

In order to manufacture an electro-luminescent quantum dot-based device, a quantum dot having a central, e.g., maximum peak, light emitting wavelength of less than or equal to about 470 nm, for example, less than about 470 nm, and less than or equal to about 465 nm may be desired. A cadmium-based quantum dot may have such a central light emitting wavelength (i.e., a light emitting peak wavelength) within the ranges, and may cause a serious environmental/contamination problem as aforementioned. Accordingly, a cadmium-free quantum dot having a central light emitting wavelength within the above ranges may be synthesized in order to realize the next generation display, a quantum dot (QD) light emitting diode (LED) device.

A type of cadmium-free quantum dot, an InP-based quantum dot, has a small bandgap compared with a cadmium-based quantum dot such as a CdSe-based one. Accordingly, an InP-based quantum dot desirably has a smaller particle size to emit blue light. However, small particle-sized semiconductor nanocrystals may not easily be uniformly dispersed. Accordingly, it may be more difficult for an InP-based quantum dot to emit blue light as compared to a cadmium-based quantum dot. An indium phosphide-based quantum dot emitting blue light of a short wavelength of less than or equal to about 470 nm with efficiency applicable to a device may be desirable.

The InP may have a zinc blend crystal lattice, and the zinc in the core may be included in the zinc blend crystal lattice of the InP.

The indium phosphide-based quantum dot according to an embodiment may show photoluminescence properties in desired ranges (e.g., a central light emitting wavelength of less than or equal to about 470 nm, for example, less than about 470 nm and less than or equal to about 465 nm and luminous efficiency of greater than or equal to about 40%) and thus contribute to manufacturing various electronic devices, for example, a quantum dot LED device.

A method of producing the semiconductor nanocrystal particle according to an embodiment includes heating a first solution including an indium precursor, a first zinc precursor, a first organic ligand, and a first organic solvent at a first temperature.

The indium precursor may include indium acetate, indium hydroxide, indium chloride, indium oxide, indium nitrate, indium sulfate, trimethyl indium, or a combination thereof.

The first zinc precursor may include a Zn metal powder, ZnO, zinc peroxide, an alkylated Zn compound (e.g., a C2 to C30 dialkyl zinc such as dimethyl zinc or diethyl zinc), a Zn carboxylate (e.g., a zinc acetate), a Zn dithiocarbamate, a zinc carbonate, a Zn nitrate, a Zn perchlorate, a Zn sulfate, a Zn acetylacetonate, a Zn halide (e.g., a zinc chloride, etc.), a Zn cyanide, a Zn hydroxide, a zinc perchlorate, or a combination thereof.

The first organic solvent may desirably be a coordinating solvent and non-coordination solvent. Examples of the organic solvent may include a C6 to C22 primary amine such as hexadecylamine, a C6 to C22 secondary amine such as a dioctylamine, a C6 to C40 tertiary amine such as a trioctyl amine, a nitrogen-containing heterocyclic compound such as pyridine, a C6 to C40 olefin such as octadecene, a C6 to C40 aliphatic hydrocarbon such as hexadecane, octadecane, or squalane, an aromatic hydrocarbon substituted with a C6 to C30 alkyl group such as phenyldodecane, phenyltetradecane, or phenyl hexadecane, a primary, secondary, or tertiary phosphine (e.g., trioctyl phosphine) substituted with at least one (e.g., 1, 2, or 3) C6 to C22 alkyl groups, a phosphine oxide (e.g., trioctylphosphine oxide) substituted with at least one (e.g., 1, 2, or 3) C6 to C22 alkyl groups, a C12 to C22 aromatic ether such as a phenyl ether, a benzyl ether, or a combination thereof, but are not limited thereto.

The first organic ligand (and/or the second organic ligand that will be described later) may coordinate the surface of the produced nanocrystal and may have an effect on the light emitting and electric characteristics, and may also well-disperse the nanocrystal in the solution phase. The organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', $RPO(OH)_2$, RHPOOH, RHPOOH (wherein, R and R' independently include a C1 to C24 substituted or unsubstituted aliphatic hydrocarbon, or a C6 to C20 substituted or unsubstituted aromatic hydrocarbon, or a combination thereof), or a combination thereof. The ligand may be may be used alone or in a mixture of two or more compounds.

Examples of the first organic ligand may be methane thiol, ethane thiol, propane thiol, butane thiol, pentane thiol, hexane thiol, octane thiol, dodecane thiol, hexadecane thiol, octadecane thiol, benzyl thiol; methane amine, ethane amine, propane amine, butane amine, pentane amine, hexane amine, octane amine, dodecane amine, hexadecyl amine, oleyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, palmitic acid, stearic acid; a phosphine such as methyl phosphine, ethyl phosphine, propyl phosphine, butyl phosphine, pentyl phosphine, tributylphosphine, or trioctylphosphine; diphenyl phosphine; a triphenyl phosphine compound such as triphenyl phosphine; a phosphine oxide such as methyl phosphine oxide, ethyl phosphine oxide, propyl phosphine oxide, butyl phosphine oxide, diphenyl phospine oxide, trioctylphosphine oxide, or triphenyl phosphine oxide; or phosphonic acid, but are not limited thereto. The organic ligand compound may be used alone or in a mixture of two or more compounds.

In order to form the core, an amount of the first zinc precursor may be greater than or equal to about 1.7 moles (mol), for example, greater than or equal to about 1.8 mol, greater than or equal to about 1.9 mol, greater than or equal to about 2.0 mol, greater than or equal to about 2.1 mol, greater than or equal to about 2.2 mol, greater than or equal to about 2.3 mol, greater than or equal to about 2.4 mol, greater than or equal to about 2.5 mol, greater than or equal to about 2.6 mol, greater than or equal to about 2.7 mol, greater than or equal to about 2.8 mol, greater than or equal to about 2.9 mol, or greater than or equal to about 3 mol, based on 1 mol of the indium precursor. In order to form the core, an amount of the first zinc precursor may be less than or equal to about 10 mol, for example, less than or equal to about 9 mol, less than or equal to about 8 mol, less than or equal to about 7 mol, less than or equal to about 6 mol, or less than or equal to about 5 mol, based on 1 mol of the indium precursor. With these amounts, the core having the composition described above may be formed. In order to form the core, an amount of the first organic ligand may be greater than or equal to about 6 mol, for example, greater than about 6 mol, greater than or equal to about 6.5 mol, greater than or equal to about 7 mol and less than or equal to about 20 mol, for example, less than or equal to about 15 mol, less than or equal to about 14 mol, less than or equal to about 13 mol, less than or equal to about 12 mol, less than or equal to about 11 mol, or less than or equal to about 10 mol based on 1 mol of In. A concentration of each component in the first solution may be appropriately selected and is not particularly limited.

The first temperature may be greater than or equal to about 100° C., greater than or equal to about 110° C., and less than about 180° C. Without wishing to be bound by any particular theory, the above temperature range may contribute to obtaining a desired core size/composition. The first solution may be heated for an appropriately selected time. For example, the first solution may be heated for greater than or equal to about 5 minutes, for example, greater than or equal to about 10 minutes, greater than or equal to about 15 minutes, greater than or equal to about 20 minutes, and greater than or equal to about 25 minutes but less than or equal to about 80 minutes and, for example, less than or equal to about 70 minutes but is not limited thereto.

Subsequently, a phosphorus precursor is added to the first solution (e.g., an input) to obtain a second solution, and the second solution is reacted at a second temperature (a core-forming temperature) to synthesize a core including a first semiconductor material including indium, phosphorus, and zinc.

The phosphorus precursor may include tris(trimethylsilyl) phosphine, tris(dimethylamino) phosphine, triethylphosphine, tributylphosphine, trioctylphosphine, triphenylphosphine, tricyclohexylphosphine, or a combination thereof, but is not limited thereto.

An amount of each component in the second solution may be appropriately selected by considering, e.g., based on, a composition/property and the like of a semiconductor nanocrystal. The first solution and the second solution may not include dodecanethiol.

The core-forming temperature may be appropriately selected from ranges of greater than or equal to about 180° C., for example, greater than or equal to about 190° C. and less than or equal to about 260° C., for example, less than or equal to about 250° C., less than or equal to about 240° C., less than or equal to about 230° C., less than or equal to about 220° C., or less than or equal to about 210° C. Time for forming the core may be appropriately selected by considering, e.g., based on, a core-forming temperature and a core size. For example, the core-forming time may be greater than or equal to about 1 minute, greater than or equal to about 2 minutes, greater than or equal to about 3 minutes, greater than or equal to about 4 minutes, and greater than or equal to about 5 minutes but for example less than or equal to about 30 minutes, less than or equal to about 25 minutes, less than or equal to about 20 minutes, and less than or equal to about 15 minutes but is not limited thereto. The core including the first semiconductor material is the same as described above. The size of the core may be adjusted by controlling the reaction temperature and the reaction time. The core may have a first absorption maximum UV wavelength of about 350 nm, for example, greater than or equal to about 365 nm and less than or equal to about 400 nm, and for example, less than or equal to about 370 nm.

After the reaction, a non-solvent is added to the second solution containing the core to separate the core from the second solution. The separated core may be dispersed in an organic solvent (e.g., mixable with the above first organic solvent or a second organic solvent to be described below).

Subsequently, a fourth solution is obtained by heating a third solution including a second zinc precursor, a second organic ligand, and a second organic solvent at a third temperature of less than a shell-forming temperature and adding the core and a sulfur precursor to the heated third solution.

The second zinc precursor, the second organic ligand, and the second organic solvent are substantially the same as the first zinc precursor, the first organic ligand, and the first organic solvent. The second organic ligand may include an amine-based compound.

The sulfur precursor has no particular limit but may be appropriately selected. Examples of the sulfur precursor may include hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), sulfur-octadecene (S-ODE), bis(trimethylsilyl) sulfide, or a combination thereof, but is not limited thereto.

An amount of each component of the fourth solution (e.g., a second zinc precursor, a sulfur precursor, a ligand, and the like) may be appropriately selected by considering, e.g., based on, a composition, a thickness, and the like of a desired shell.

The fourth solution is heated at a shell-forming temperature and thus forms a shell including a second semiconductor material including zinc and sulfur on the core. The obtained semiconductor nanocrystal particle may show the above composition/structure and photoluminescence properties.

The shell-forming temperature may be appropriately selected by considering, e.g., based on, a shell thickness, composition, and the like. For example, the shell-forming temperature may be greater than or equal to about 200° C., for example, greater than or equal to about 210° C., greater than or equal to about 230° C., greater than or equal to about 240° C., greater than or equal to about 250° C., greater than or equal to about 260° C., greater than or equal to about 270° C., greater than or equal to about 280° C., greater than or equal to about 290° C., greater than or equal to about 300° C., greater than or equal to about 310° C., greater than or equal to about 315° C., greater than or equal to about 316° C., greater than or equal to about 317° C., greater than or equal to about 318° C., and greater than or equal to about 319° C. The shell-forming temperature may be, for example, less than or equal to about 360° C., less than or equal to about 350° C., less than or equal to about 340° C., less than or equal to about 330° C., and less than or equal to about 325° C. The shell-forming time may be appropriately selected by considering, e.g., based on, a shell thickness, composition, and the like.

After the completion of the reaction, a nonsolvent may be added to a reaction product and thereby nanocrystal particles coordinated with the organic ligand compound may be separated. The nonsolvent may be a polar solvent that is miscible with the solvent used in the core formation and/or shell formation reactions and is not capable of dispersing the produced nanocrystals therein. The nonsolvent may be selected depending, e.g., based, on the solvent used in the reaction and may be for example acetone, ethanol, butanol, isopropanol, ethanediol, water, tetrahydrofuran (THF), dimethylsulfoxide (DMSO), diethylether, formaldehyde, acetaldehyde, ethylene glycol, a solvent having a similar solubility parameter to the foregoing solvents, or a combination thereof. The nanocrystal particles may be separated via centrifugation, sedimentation, chromatography, or distillation. The separated nanocrystals may be added to a washing solvent and washed, if desired. Types of the washing solvent are not particularly limited and may have a similar solubility parameter to that of the ligand and may, for example, include hexane, heptane, octane, chloroform, toluene, benzene, and the like.

In an embodiment, an electronic device includes the semiconductor nanocrystal particle(s). The device may include a display device, a light emitting diode (LED), an organic light emitting diode (OLED), a sensor, a solar cell, an image sensor, or a liquid crystal display (LCD), but is not limited thereto. In an embodiment, the electronic device may be a photoluminescence element (e.g., a lighting such as a quantum dot sheet or a quantum dot rail, a liquid crystal display (LCD)) or an electric field light emitting element (e.g., a QD LED).

In a non-limiting embodiment, the electronic device may be an electric field light emitting element. The electronic device may include a first electrode and a second electrode facing each other and a quantum dot emission layer disposed between the first electrode and the second electrode and including a plurality of quantum dots. The plurality of quantum dots includes the blue light emitting semiconductor nanocrystal particle. The electronic device may include an auxiliary layer (e.g., an electron auxiliary layer such as an electron transport layer or a hole auxiliary layer such as a hole transport layer) including ZnO between the first electrode and the quantum dot emission layer or between the second electrode and the quantum dot emission layer.

A device according to an embodiment is shown in FIG. 1. Hereinafter, the first electrode is referred to as an anode 1 and the second electrode is referred to as a cathode 5, but they are not limited thereto.

The cathode 5 may include an electron injection conductor having a low work function. The anode 1 may include a hole injection conductor having a relatively high work function. The electron/hole injection conductor may include a metal-based material (aluminum, magnesium, tungsten, nickel, cobalt, platinum, palladium, calcium, LiF, and the like) (e.g., a metal, a metal compound, an alloy, a combination thereof), a metal oxide such as gallium indium oxide or indium tin oxide, or a conductive polymer such as polyethylene dioxythiophene (e.g., having a relatively high work function), but is not limited thereto.

At least one of the first electrode and the second electrode may be a light transmitting electrode or a transparent electrode. In an embodiment, both of the first electrode and the second electrode may be light transmitting electrodes. The electrode(s) may be patterned.

The light transmitting electrode may be made of, for example a transparent conductor such as indium tin oxide (ITO) or indium zinc oxide (IZO), gallium indium tin oxide, zinc indium tin oxide, titanium nitride, polyaniline, or LiF/Mg:Ag, or a metal thin film of a thin monolayer or multilayer, but is not limited thereto. When one of the first electrode and the second electrode is a non-light transmitting electrode, it may be made of, for example, an opaque conductor such as aluminum (Al), a lithium aluminum (Li:Al) alloy, a magnesium-silver alloy (Mg:Ag), or a lithium fluoride-aluminum (LiF:Al).

The light transmitting electrode may be disposed on a transparent substrate (e.g., insulating transparent substrate). The substrate may be rigid or flexible. The substrate may be a plastic, glass, or a metal.

Thicknesses of the electrodes (first electrode and/or second electrode) are not particularly limited and may be selected considering device efficiency. For example, the thickness of the electrode may be greater than or equal to about 5 nm, for example, greater than or equal to about 50 nm. For example, the thickness of the electrode may be less than or equal to about 100 micrometers (μm), less than or equal to about 10 μm, less than or equal to about 1 μm, less than or equal to about 900 nm, less than or equal to about 500 nm, or less than or equal to about 100 nm.

The quantum dot emission layer 3 includes a plurality of quantum dots. The plurality of quantum dots includes the blue light emitting semiconductor nanocrystal particle according to the embodiments. The quantum dot emission layer may include a monolayer of the blue light emitting semiconductor nanocrystal particles.

Figure 2:
FIG. 2 shows a schematic cross-section of an electronic device according to a non-limiting embodiment.

The electronic device may include charge (hole or electron) auxiliary layers 2 and 4 between the anode 1 and the cathode 5. For example, the electronic device may include a hole auxiliary layer 2 or an electron auxiliary layer 4 between the anode and the quantum dot emission layer and/or between the cathode and the quantum dot emission layer. (refer to FIG. 2)

The hole auxiliary layer may include for example a hole injection layer (HIL) to facilitate hole injection, a hole transport layer (HTL) to facilitate hole transport, an electron blocking layer (EBL) to inhibit electron transport, or a combination thereof, but is not limited thereto. For example, the hole injection layer (HIL) may be disposed between the hole transport layer (HTL) and the anode. For example, the electron blocking layer may be disposed between the emission layer and the hole transport (injection) layer, but is not limited thereto.

A thickness of each layer of the hole auxiliary layer(s) may be desirably selected. For example, each thickness of the layer may be about 20 nm to about 50 nm, but is not limited thereto.

The electron auxiliary layer may include for example an electron injection layer (EIL) to facilitate electron injection, an electron transport layer (ETL) to facilitate electron transport, a hole blocking layer (HBL) to inhibit hole transport, or a combination thereof, but is not limited thereto.

For example, the electron injection layer may be disposed between the electron transport layer and the cathode. For example, the hole blocking layer may be disposed between the emission layer and the electron transport (injection) layer, but is not limited thereto. A thickness of each layer of the electron auxiliary layer(s) may be desirably selected. For example, each thickness of the layer may be about 20 nm to about 50 nm, but is not limited thereto.

The quantum dot emission layer may be disposed in the hole injection (or transport) layer or an electron injection (or transport) layer. The quantum dot emission layer may be disposed between the hole auxiliary layer and the electron auxiliary layer.

The charge auxiliary layer, the electron blocking layer, and the hole blocking layer may include for example an organic material, an inorganic material, or an organic/inorganic material. The charge auxiliary layer, the electron blocking layer, and the hole blocking layer may include for example an organic material, an inorganic material, or an organic/inorganic material.

The hole injection and/or transport layers may, each independently, include for example poly(3,4-ethylenedioxythiophene):poly(styrene sulfonate) (PEDOT:PSS), poly(9,9-dioctyl-fluorene-co-N-(4-butylphenyl)-diphenylamine) (TFB), polyarylamine, poly(N-vinylcarbazole), polyaniline, polypyrrole, N,N,N',N'-tetrakis (4-methoxyphenyl)-benzidine (TPD), 4-bis[N-(1-naphthyl)-N-phenyl-amino]biphenyl (α-NPD), m-MTDATA (4,4',4"-tris[phenyl(m-tolyl)amino]triphenylamine), 4,4',4"-tris(N-carbazolyl)-triphenylamine (TCTA), 1,1-bis[(di-4-tolylamino)phenylcyclohexane (TAPC), a p-type metal oxide (e.g., NiO, $WO_3$, $MoO_3$, etc.), a carbon-based material such as graphene oxide, or a combination thereof, respectively, but are not limited thereto.

The electron blocking layer (EBL) may include for example poly(3,4-ethylenedioxythiophene):poly(styrene sulfonate) (PEDOT:PSS), poly(9,9-dioctyl-fluorene-co-N-(4-butylphenyl)-diphenylamine) (TFB) polyarylamine, poly (N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4"-tris(N-carbazolyl)-triphenylamine (TCTA), or a combination thereof, but is not limited thereto.

The electron transport layer (ETL) may include for example 1,4,5,8-naphthalene-tetracarboxylic dianhydride (NTCDA), bathocuproine (BCP), tris[3-(3-pyridyl)-mesityl] borane (3TPYMB), LiF, $Alq_3$, $Gaq_3$, $Inq_3$, $Znq_2$, $Zn(BTZ)_2$, $BeBq_2$, an n-type metal oxide (e.g., ZnO, $HfO_2$, etc.), or a combination thereof, but is not limited thereto. The n-type metal oxide may be crystalline. The n-type metal oxide may be (crystalline) nanoparticles. The electron transport layer (ETL) may include crystalline ZnO nanoparticles.

The hole blocking layer (HBL) may include for example 1,4,5,8-naphthalene-tetracarboxylic dianhydride (NTCDA), bathocuproine (BCP), tris[3-(3-pyridyl)-mesityl] borane (3TPYMB), LiF, $Alq_3$, $Gaq_3$, $Inq_3$, $Znq_2$, $Zn(BTZ)_2$, $BeBq_2$, or a combination thereof, but is not limited thereto.

Figure 3:
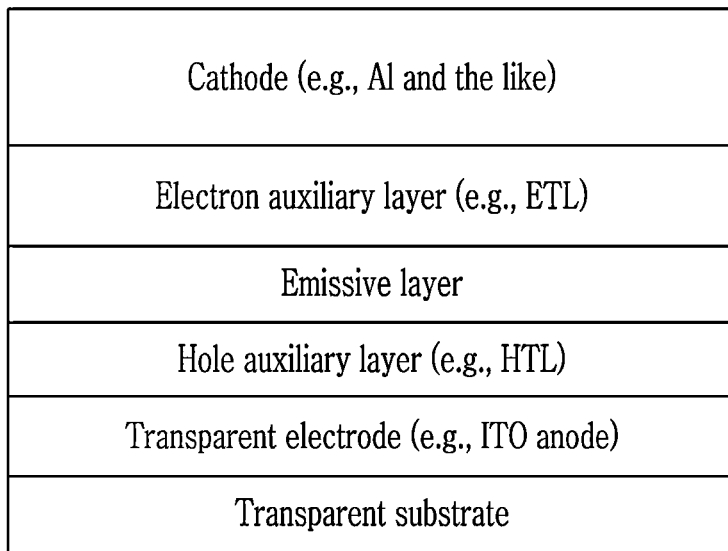
FIG. 3 shows a schematic cross-section of an electronic device according to a non-limiting embodiment.

In an embodiment, the anode may include a metal oxide-based transparent electrode and the cathode may include a (conductive) metal (Mg, Al, etc.) (e.g., of a relatively low work function). For example, PEDOT:PSS, TFB, and/or a p-type metal oxide may be disposed as a hole auxiliary layer (e.g., hole injection layer or hole transport layer) between the transparent electrode and the emission layer, e.g., emissive layer. (see, FIG. 3)

Figure 4:
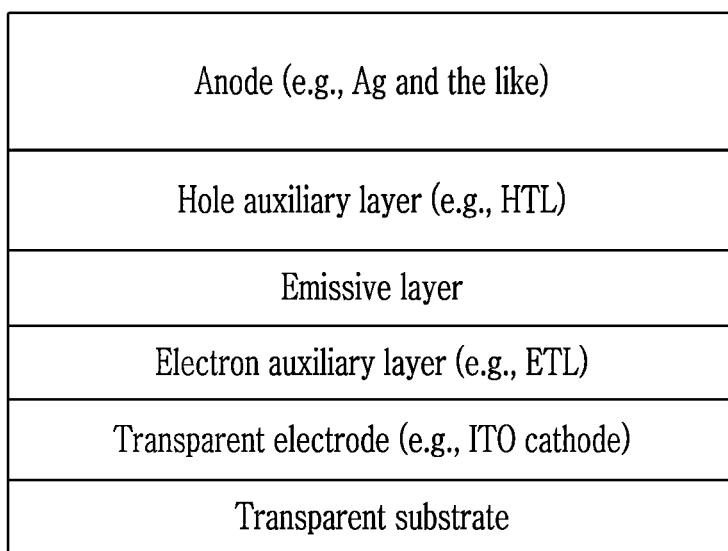
FIG. 4 shows a schematic cross-section of an electronic device according to a non-limiting embodiment.

In an embodiment, the cathode may include a metal oxide-based transparent electrode (e.g., ITO, FTO, etc.) and the anode may include a metal (e.g., Al, Au, Ag, etc.) of a relatively high work function. (Inverted structure) For example, an n-type metal oxide (ZnO) may be disposed between the cathode and the emission layer as an electron auxiliary layer (e.g., an electron transport layer). $MoO_3$ or another p-type metal oxide may be disposed between the metal anode and the quantum dot emission layer as a hole auxiliary layer (e.g., a hole transport layer and/or hole injection layer). (see FIG. 4)

Hereinafter, specific examples are illustrated. However, these examples are exemplary, and the present disclosure is not limited thereto.

EXAMPLES

Analysis Method

[1] Photoluminescence Analysis

Photoluminescence (PL) spectra of nanocrystals are obtained by using a Hitachi F-7000 spectrometer at an irradiation wavelength of 372 nanometers (nm).

[2] Ultraviolet (UV) Spectroscopy Analysis

A UV spectroscopy analysis is performed by using an Agilent Cary-5000 spectrometer to obtain a UV-Visible absorption spectrum.

[3] Transmission Electron Microscope (TEM) Analysis

Transmission electron microscope photographs of the nanocrystals are obtained using an UT F30 Tecnai electron microscope.

[4] Inductively Coupled Plasma (ICP) Analysis

An inductively coupled plasma-atomic emission spectroscopy (ICP-AES) analysis is performed using Shimadzu ICPS-8100.

Synthesis is performed under an inert gas atmosphere unless particularly mentioned.

Example 1

[1] Production of InZnP Core 0.12 millimoles (mmol) of indium acetate, 0.36 mmol of zinc acetate, and 1.08 mmol of palmitic acid are dissolved in a 1-octadecene solvent in a 200 milliliter (mL) reactor, and the reactor is heated at 120° C. under vacuum. After one hour, an atmosphere in the reactor is converted into nitrogen. The reactor is heated at 150° C., a mixed solution of 0.1 mmol of tris(trimethylsilyl)phosphine ($TMS_3P$) and 1 mL of trioctylphosphine is rapidly put therein, and the mixture is reacted for 10 minutes. The reaction solution is rapidly cooled down to room temperature, acetone is added thereto, and the mixture is centrifuged, and a precipitate obtained therefrom is dispersed in toluene. Referring to a UV spectrum of the obtained InZnP semiconductor nanocrystal (a core), the core has a UV first absorption maximum wavelength of 360 nm and thus a diameter of about 1.6 nm.

[2] Formation of ZnS Shell 1.2 mmoL of zinc acetate and 2.4 mmol of oleic acid are dissolved in a trioctylamine solvent in a 200 mL reaction flask and then, vacuum-treated at 120° C. for 10 minutes. The flask is internally substituted with nitrogen ($N_2$) and then, heated up to 280° C.

Subsequently, the InZnP core according to Reference Example 1 is rapidly added thereto, 0.01 mmol of S/TOP is added thereto, and the mixture is heated up to 320° C. and reacted to form a shell for 60 minutes.

Figure 5:
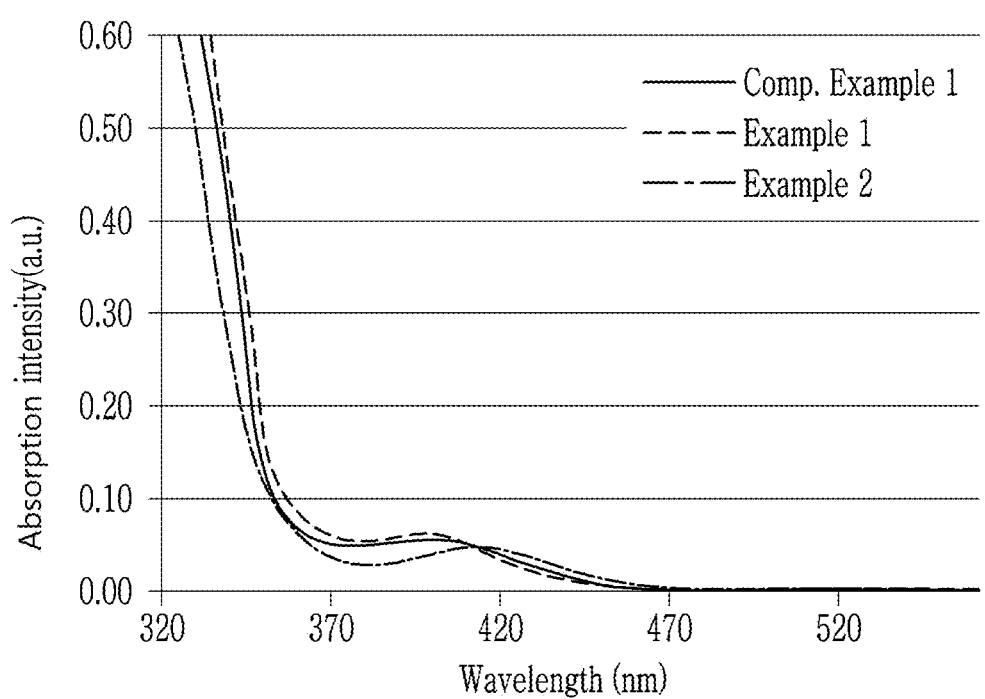
FIG. 5 shows ultraviolet-visible (UV-Vis) absorption spectra of absorption intensity (arbitrary units (a.u.)) versus wavelength (nm) of the semiconductor nanocrystal particles produced in Examples and Comparative Examples.

The reaction solution is rapidly cooled down to room temperature, acetone is added thereto, and the mixture is centrifuged to obtain a precipitate, and the precipitate is dispersed in toluene. FIG. 5 shows a UV-vis spectrum of the obtained InZnP semiconductor nanocrystal. The InZnP semiconductor nanocrystal has a UV first absorption maximum wavelength of 400 nm.

[3] Analysis

Figure 6:
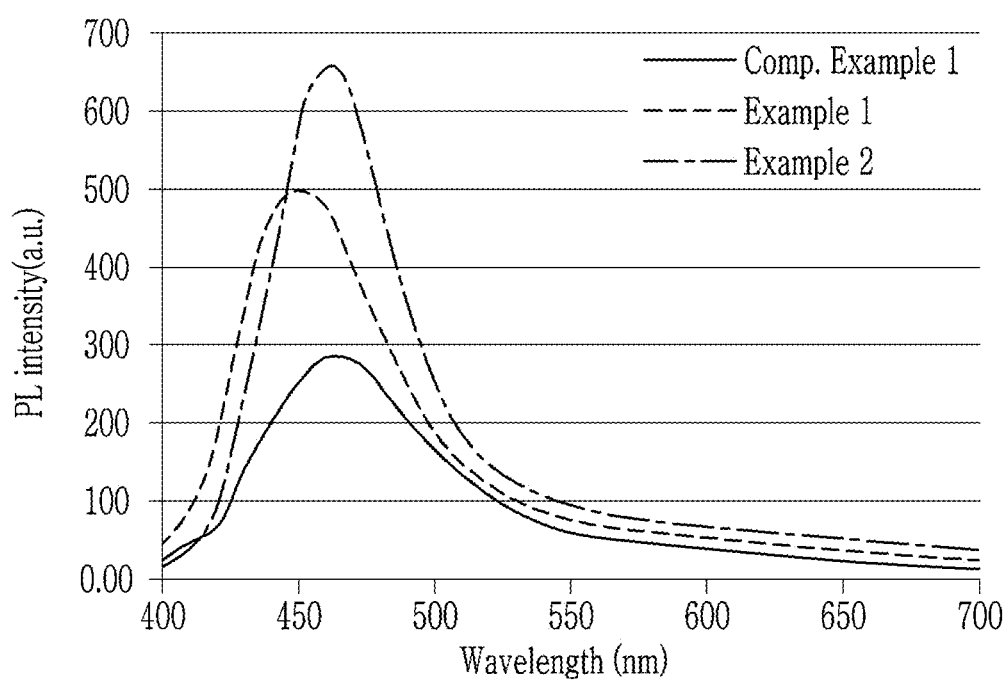
FIG. 6 shows PL spectra of PL intensity ((a.u.) versus wavelength (nm) of the semiconductor nanocrystal particles produced in Examples and Comparative Examples.

Photoluminescence properties of the produced semiconductor nanocrystal are analyzed, and the results are shown in FIG. 6 and Table 1. Inductively coupled plasma-atomic emission spectroscopy of the semiconductor nanocrystal particle is performed, and the result is shown in Table 1.

Figure 7:
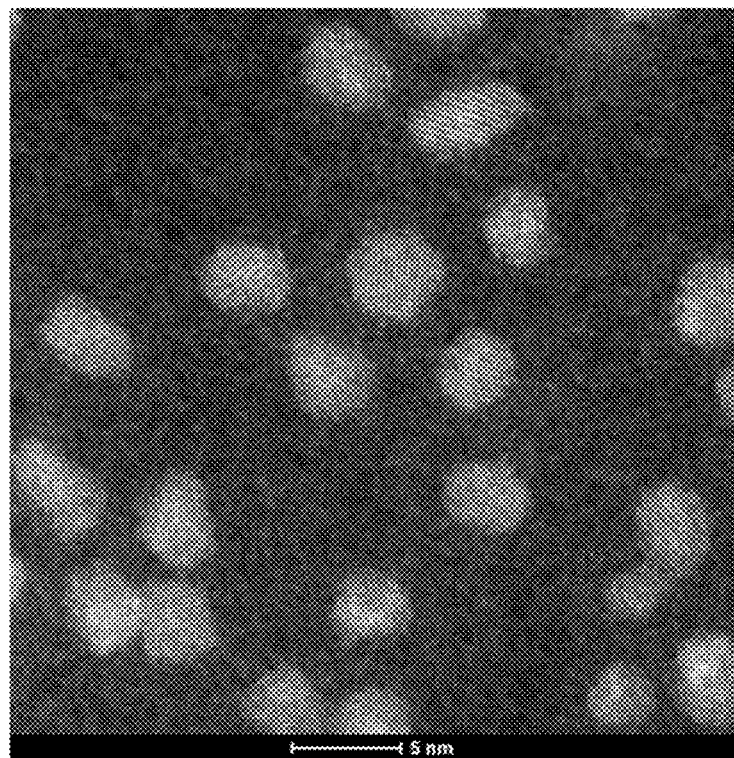
FIG. 7 shows a transmission electron microscope image of the semiconductor nanocrystal particle produced in Example.
Figure 8:
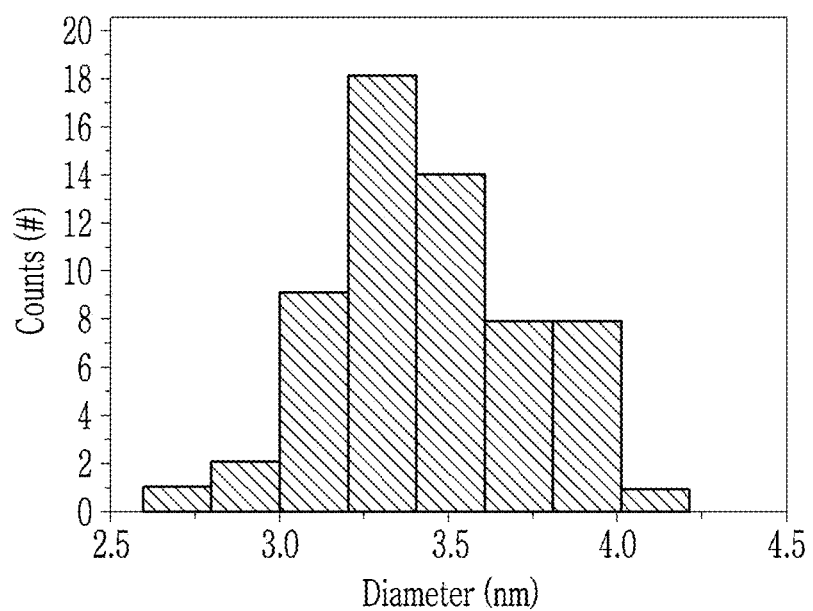
FIG. 8 shows a size distribution of counts (number (#)) versus diameter (nm) of the semiconductor nanocrystal particle produced in Example.

A transmission electron microscope analysis of the semiconductor nanocrystal is performed, and the result is shown in FIG. 7. A TEM image of the semiconductor nanocrystal is used to measure a particle size, and a distribution of the semiconductor nanocrystal is shown in FIG. 8. Referring to FIG. 8, the produced semiconductor nanocrystal has an average particle size of 3.5 nm.

Example 2

[1] Production of InZnP Core

An InZnP core is prepared according to the same method as Example 1 except for increasing the reaction time into 15 minutes at 200° C. after putting $TMS_3P$ therein. Referring to a UV spectrum of the obtained InZnP semiconductor nanocrystal (a core), the core has a UV first absorption maximum wavelength of 412 nm and thus, a diameter of about 1.9 nm.

[2] Formation of ZnS Shell

A shell-forming reaction is performed in the same method as Example 1 except for using the core according to [1].

[3] Analysis

Photoluminescence properties of the produced semiconductor nanocrystal are analyzed, and the results are shown in FIG. 6 and Table 1. Inductively coupled plasma-atomic emission spectroscopy of the semiconductor nanocrystal particle is performed, and the result is shown in Table 1.

Comparative Example 1

[1] Production of InZnP Core

An InZnP core is prepared according to the same method as Example 1 except for using 0.2 mmol of zinc acetate and 0.76 mmol of palmitic acid. Referring to a UV spectrum of the obtained InZnP semiconductor nanocrystal (the core), the core has a UV first absorption maximum wavelength of 398 nm and thus a diameter of about 1.8 nm.

[2] Formation of ZnS Shell

A shell-forming reaction is performed in the same manner as in Example 1 except for using the core prepared according to [1].

[3] Analysis

UV-Vis absorption characteristics and photoluminescence properties of the semiconductor nanocrystal are analyzed, and the result is shown in FIG. 6 and Table 1. Inductively coupled plasma-atomic emission spectroscopy of the semiconductor nanocrystal particle is performed, and the result is shown in Table

TABLE 1

| Samples | UV absorption wavelength (nm) | PL, Full Width at Half Maximum (FWHM) (nm) | QY (%) | Mole ratio relative to In (ICP-AES) | | | |
|---|---|---|---|---|---|---|---|
| | | | | P | S | Zn | In |
| Comparative Example 1 | 398 | 464, 75 | 21 | 0.88:1 | 16.4:1 | 21.7:1 | 1.0:1 |
| Example 1 | 395 | 451, 64 | 41 | 0.82:1 | 26.6:1 | 30.4:1 | 1.0:1 |
| Example 2 | 412 | 461, 56 | 60 | 0.59:1 | 25.7:1 | 31.5:1 | 1.0:1 |

Referring to the results of Table 1, the semiconductor nanocrystal particles according to Examples 1 and 2 show remarkably improved quantum efficiency and a narrow full width at half maximum (FWHM) compared with a quantum dot according to Comparative Example 1 in a blue light emitting region.

Example 3: Manufacture of Device 1

Figure 9:
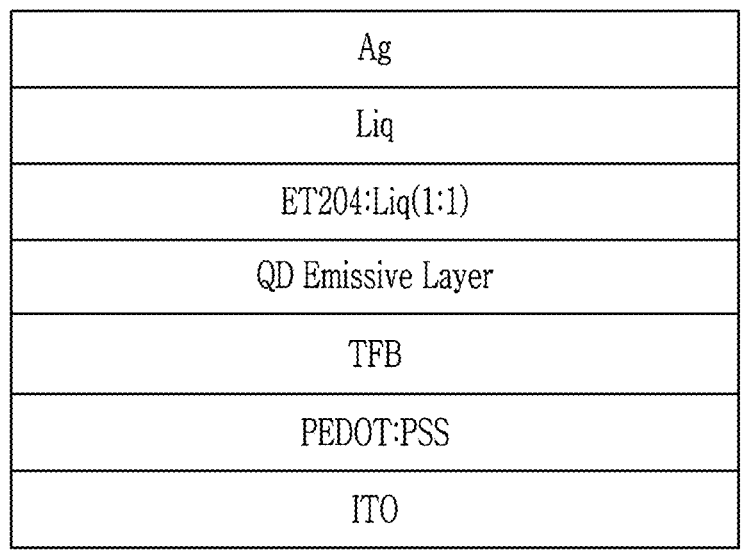
FIG. 9 is a schematic cross-sectional view showing the device (normal structure) manufactured in Example 3.
Figure 10:
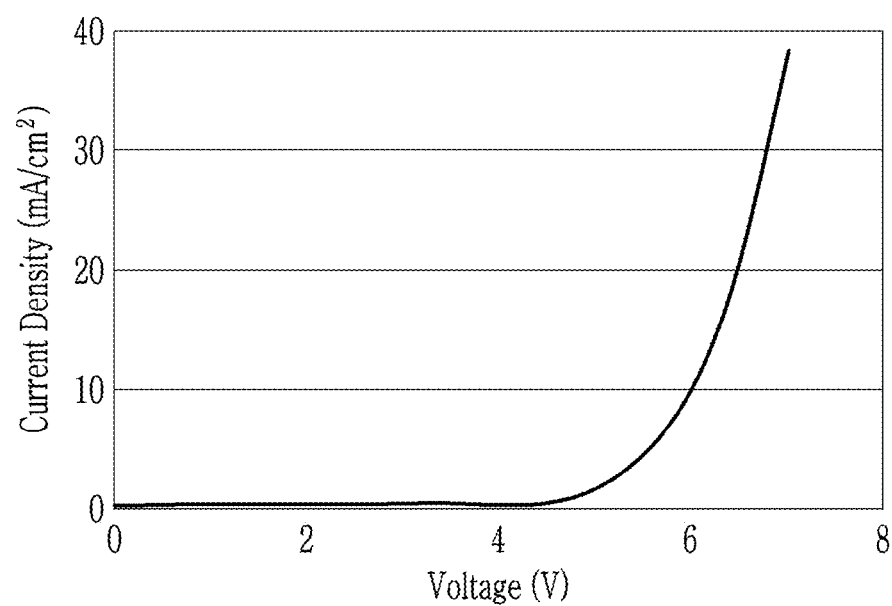
FIG. 10 shows an electro-luminescence property of current density (milliamperes per square centimeter ($mA/cm^2$)) versus voltage (volts (V)) of the device manufactured in Example 3.
Figure 11:
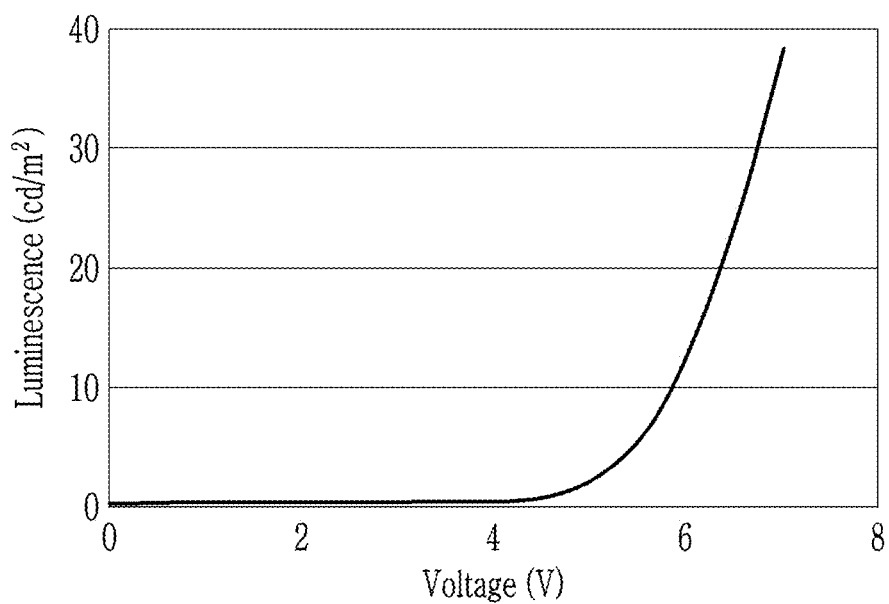
FIG. 11 shows an electro-luminescence property of luminescence (candelas per square centimeter ($cd/cm^2$)) versus voltage (V) of the device manufactured in Example 3.
Figure 12:
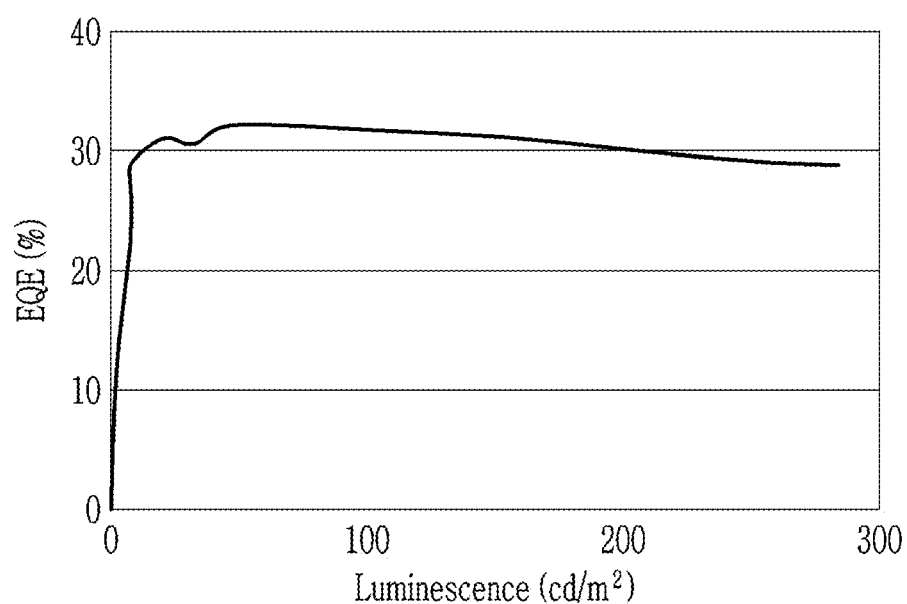
FIG. 12 shows an electro-luminescence property of External Quantum Efficiency (EQE) (percent (%)) versus luminescence ($cd/cm^2$) of the device manufactured in Example 3.
Figure 13:
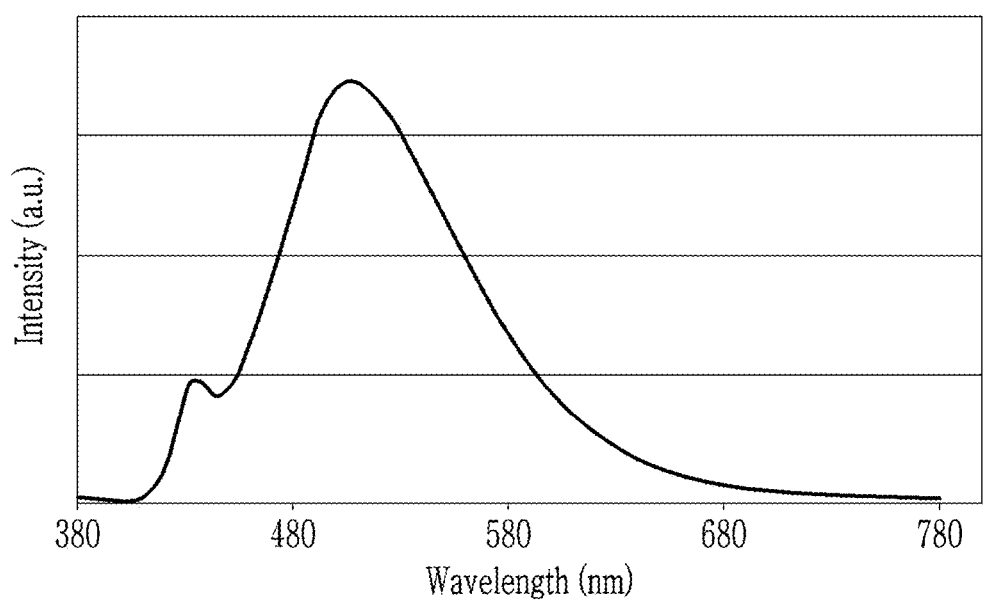
FIG. 13 shows an electro-luminescence property of intensity (a.u.) versus wavelength (nm) of the device manufactured in Example 3.

A device (indium tin oxide (ITO)/poly(3,4-ethylenedioxythiophene) (PEDOT):poly(styrene sulfonate) (PSS)/poly(9,9-dioctyl-fluorene-co-N-(4-butylphenyl)-diphenylamine) (TFB)/quantum dot (QD)/ET204(8-(4-(4,6-di(naphthalen-2-yl)-1,3,5-triazin-2-yl)phenyl)quinolone):8-quinolinolato lithium (Liq)(1:1)/Liq/Al) shown in FIG. 9 is manufactured by using the semiconductor nanocrystal particle according to Example 1.

Specifically, an ITO electrode is deposited on a substrate, and PEDOT:PSS and TFB layers are respectively spin-coated thereon. On the TFB layer, a dispersion of a quantum dot in octane is spin-coated. An organic electron transport layer (ETL, ET204:Liq) is formed through a vacuum deposition, and then, an Al electrode is deposited thereon.

Electroluminescence properties of the device are measured by applying a voltage (0 to 7 volts (V)) between the ITO electrode and the Al electrode. Device properties are shown in FIGS. 10, 11, 12, and 13. Referring to the figures, a blue light emitting device using InP QD is realized.

Example 4

Figure 14:
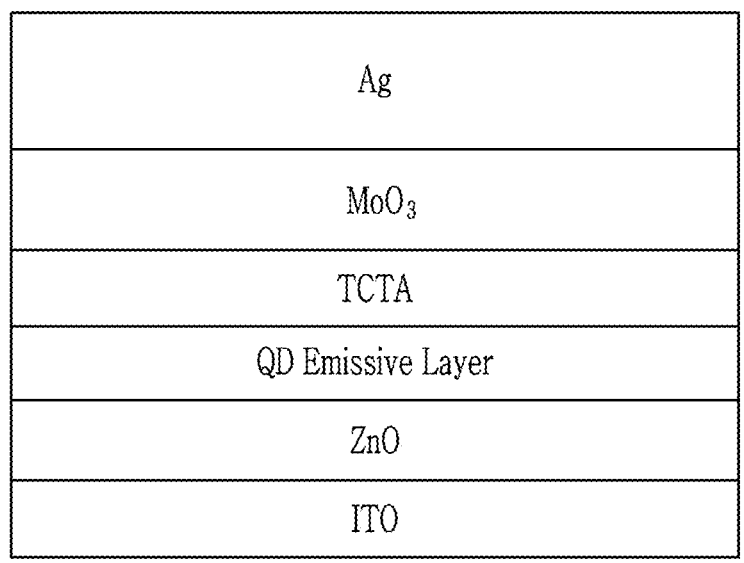
FIG. 14 is a schematic cross-sectional view showing the device (inverted structure) manufactured in Example 4.
Figure 15:
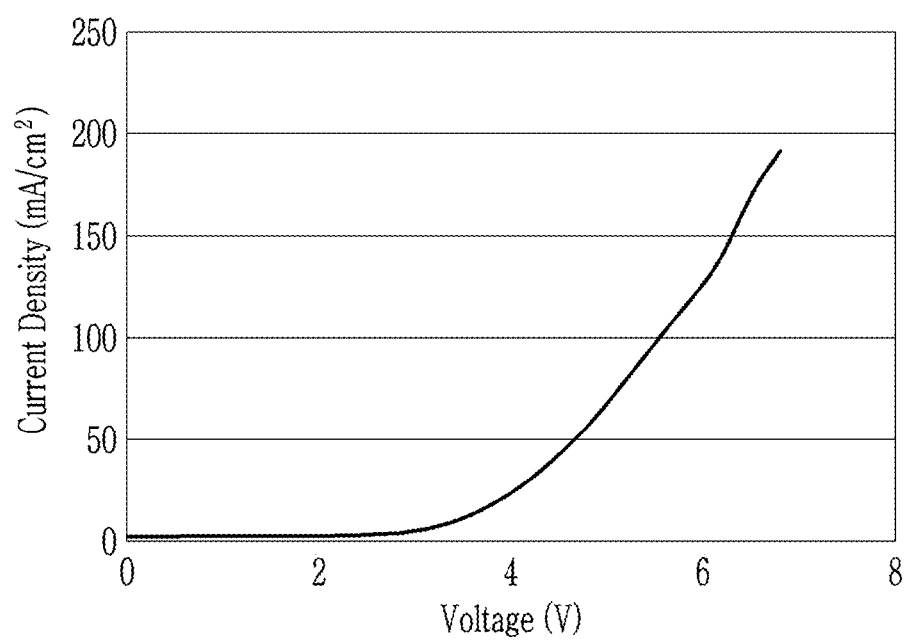
FIG. 15 shows an electro-luminescence property of current density ($mA/cm^2$) versus voltage (V) of the device manufactured in Example 4.
Figure 16:
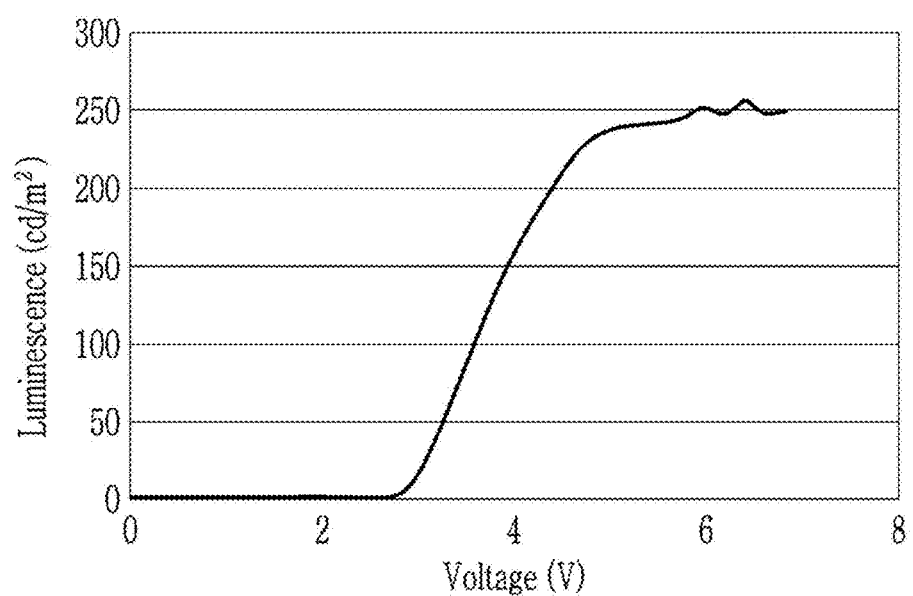
FIG. 16 shows an electro-luminescence property of luminescence ($cd/m^2$) versus voltage (V) of the device manufactured in Example 4.
Figure 17:
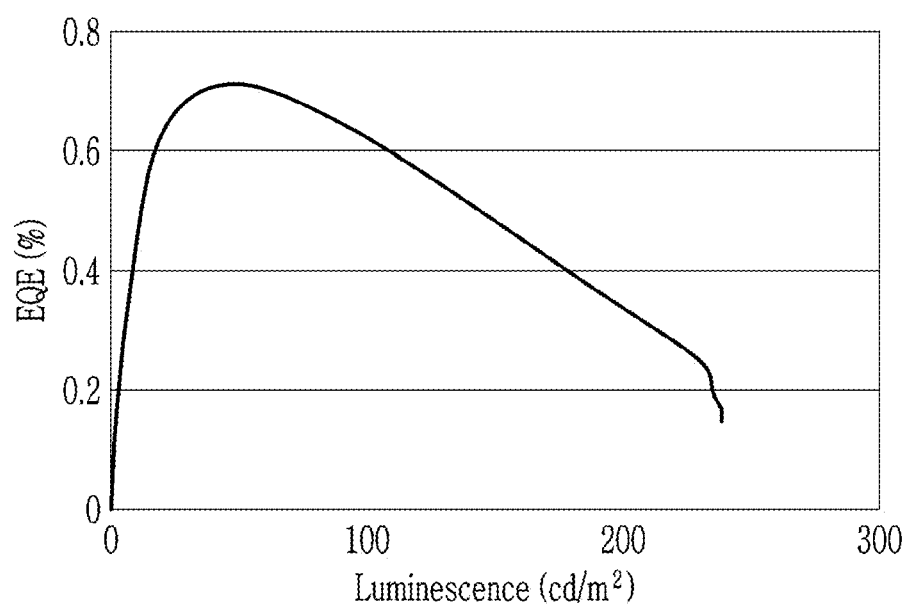
FIG. 17 shows an electro-luminescence property of EQE (%) versus luminescence ($cd/cm^2$) of the device manufactured in Example 4.
Figure 18:
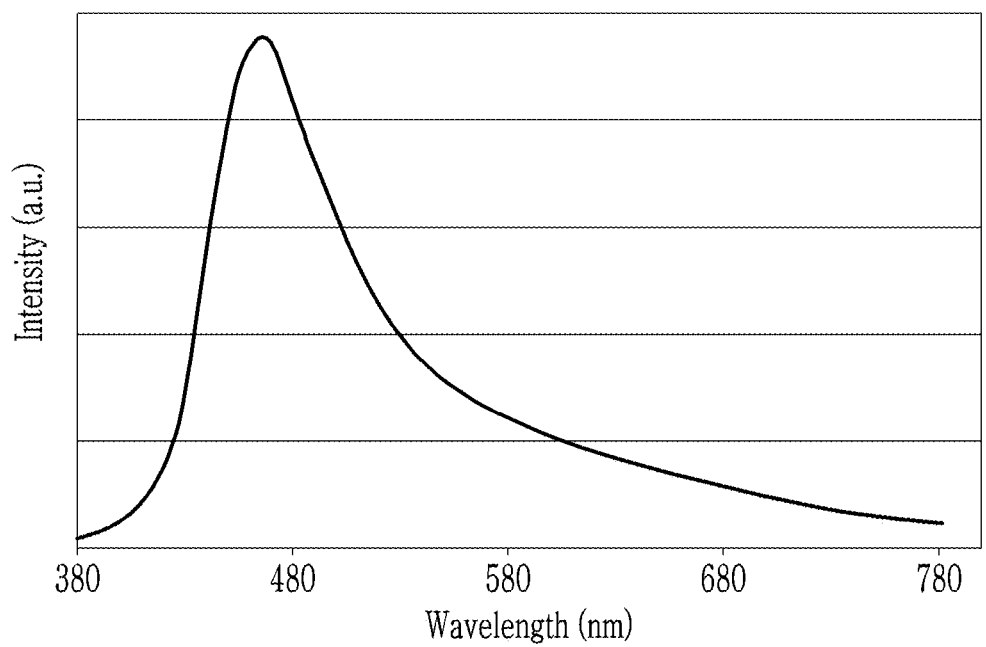
FIG. 18 shows an electro-luminescence property of intensity (a.u.) versus wavelength (nm) of the device manufactured in Example 4.

In Example 1, a device (ITO/ZnO/QD/4,4',4''-tris(N-carbazolyl)-triphenylamine (TCTA)/$MoO_3$/Ag) shown in FIG. 14 by using the semiconductor nanocrystal particle is manufactured in the following method. Electroluminescence properties of the device are measured by applying a voltage (0 to 7 V) between the ITO electrode and the Ag electrode. Device properties are shown in FIGS. 15, 16, 17, and 18. Referring to FIGS. 15-18 and 10-13, the device of Example 4 uses ZnO but shows the same blue electro-luminescence as the device using an organic ETL according to Example 3 and improved color purity compared with that of Example 3.

The device is manufactured by spin-coating ZnO on ITO, and then, QD, hole transport layer (HTL), and an electrode are similarly deposited to those of Example 3.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A semiconductor nanocrystal particle, comprising sulfur, indium, zinc, and phosphorus,
   wherein a mole ratio of a total amount of the zinc in the semiconductor nanocrystal particle relative to a total amount of the indium in the semiconductor nanocrystal particle is greater than or equal to about 25:1,
   the semiconductor nanocrystal particle comprises
      a core, the core comprising a first semiconductor material comprising indium, zinc, and phosphorus, and
      a shell disposed on the core, the shell comprising a second semiconductor material comprising zinc and sulfur, and
   the semiconductor nanocrystal particle emits blue light having a maximum peak emission at a wavelength of from 440 nanometers to 470 nanometers, and the semiconductor nanocrystal particle has quantum efficiency of greater than or equal to about 45%.

2. The semiconductor nanocrystal particle of claim 1, wherein the semiconductor nanocrystal particle emits blue light having a maximum peak emission at a wavelength of from 440 nanometers to about 468 nanometers.

3. The semiconductor nanocrystal particle of claim 1, wherein the mole ratio of the total amount of the zinc in the semiconductor nanocrystal particle relative to the total amount of the indium in the semiconductor nanocrystal particle is greater than or equal to about 29:1.

4. The semiconductor nanocrystal particle of claim 1, wherein the semiconductor nanocrystal particle has a mole ratio of the sulfur relative to the indium of greater than or equal to about 18:1.

5. The semiconductor nanocrystal particle of claim 1, wherein the semiconductor nanocrystal particle has a mole ratio of the phosphorus relative to the indium of less than about 1:1.

6. The semiconductor nanocrystal particle of claim 1, wherein the zinc in the core is in a crystal lattice of InP.

7. The semiconductor nanocrystal particle of claim 1, wherein the first semiconductor material comprises InZnP and the second semiconductor material comprises ZnS.

8. The semiconductor nanocrystal particle of claim 1, wherein the semiconductor nanocrystal particle has an average size of less than or equal to about 4.5 nanometers.

9. The semiconductor nanocrystal particle of claim 1, wherein the semiconductor nanocrystal particle has an average size of less than or equal to about 4 nanometers.

10. The semiconductor nanocrystal particle of claim 1, wherein the core has a size of less than or equal to about 2 nanometers.

11. The semiconductor nanocrystal particle of claim 1, wherein the shell does not comprise selenium.

12. The semiconductor nanocrystal particle of claim 1, wherein the semiconductor nanocrystal particle has quantum efficiency of greater than or equal to about 50%.

13. The semiconductor nanocrystal particle of claim 1, wherein a maximum peak emission of the blue light has a full width at half maximum of less than or equal to about 60 nanometers.

14. A display device comprising the semiconductor nanocrystal particle of claim 1.

* * * * *